(12) United States Patent
Heiland

(10) Patent No.: US 6,884,992 B1
(45) Date of Patent: Apr. 26, 2005

(54) IMAGING AND/OR RASTER-MODE SCANNING SYSTEM PROVIDED WITH A DEVICE FOR COMPENSATING THE IMAGE DEGRADATIONS RESULTING FROM ENVIRONMENTAL FACTORS

(76) Inventor: Peter Heiland, Karl-Liebknecht-Strasse 30, D-65479 Raunheim (DE)

( * ) Notice: Subject to any disclaimer, the term of this patent is extended or adjusted under 35 U.S.C. 154(b) by 0 days.

(21) Appl. No.: 09/423,155
(22) PCT Filed: Apr. 29, 1998
(86) PCT No.: PCT/DE98/01186
  § 371 (c)(1),
  (2), (4) Date: Nov. 2, 1999
(87) PCT Pub. No.: WO98/50938
  PCT Pub. Date: Nov. 12, 1998

(30) Foreign Application Priority Data

May 3, 1997 (DE) .......................................... 197 18 799

(51) Int. Cl.⁷ ................................................ H01J 3/14
(52) U.S. Cl. ...................................... 250/234; 248/550
(58) Field of Search ............................ 250/214 C, 234, 250/201.1; 318/128, 649; 248/550, 638

(56) References Cited

U.S. PATENT DOCUMENTS 4,929,874 A * 5/1990 Mizuno et al. ............. 318/128
4,948,971 A    8/1990 Vogen et al. ................ 250/310

FOREIGN PATENT DOCUMENTS

| JP | 01052369 | 2/1989  | .......... H01J/37/147 |
| JP | 01286244 | 11/1989 | ............ H01J/37/22  |
| JP | 06162982 | 11/1992 | ............ H01J/37/16  |
| JP | 05079811 | 3/1993  | ............ G01B/7/34   |
| JP | 08321274 | 12/1996 | ............ H01J/37/16  |

OTHER PUBLICATIONS

PCT/DE98/01186 International Search Report dated Nov. 16, 1998.

* cited by examiner

Primary Examiner—Thanh X. Luu

(57) ABSTRACT

An imaging and raster-mode scanning apparatus has a compensation device for compensating for ambient influences that may degrade the imaging, comprising an electrical filter, and at least one sensor for providing a first signal dependent on the ambient influences the first signal passes through the filter directly and drives an internal actuator and a internal control elements of the apparatus, which has an effect on the imaging and on the image display, in a calibrated state of the apparatus, which comprises a setting of a transfer characteristic of the filter, image degradations are greatly reduced or essentially compensated for. The filter for calibrating the apparatus, has a calibration input and a second signal is applied to the calibration input of the filter.

41 Claims, 7 Drawing Sheets

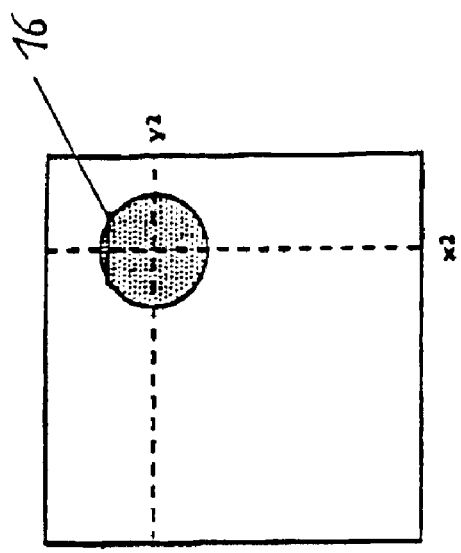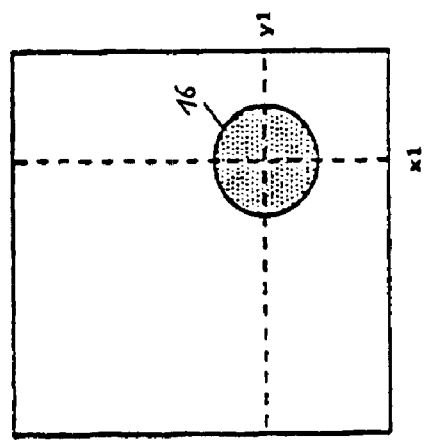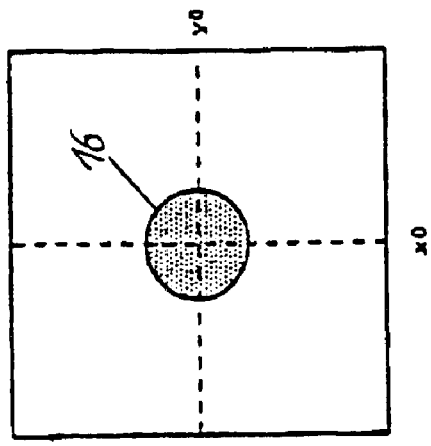
Fig 6

IMAGING AND/OR RASTER-MODE SCANNING SYSTEM PROVIDED WITH A DEVICE FOR COMPENSATING THE IMAGE DEGRADATIONS RESULTING FROM ENVIRONMENTAL FACTORS

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates to an imaging and/or raster-mode scanning apparatus and to a method for operating an apparatus of this type with a device for compensating for ambient influences that may cause imaging degradations.

FIELD OF THE INVENTION

Imaging and/or raster-mode scanning apparatuses, for example scanning electron microscopes, force microscopes and light scanning microscopes, have attained great importance in many methods for inspecting samples.

However, these measurements are frequently influenced by external ambient conditions such that the imaging quality is diminished. This results, under certain circumstances, in an undesirable degradation of the resolving power and/or in defective imaging. In the following text, an imaging degradation of this type is generally described as the occurrence of imaging or image defects. In the case of electron scanning microscopes, by way of example, an influencing variable that diminishes the imaging quality may be an electromagnetic interference field which influences the electron orbits.

Furthermore, air and/or ground vibrations in the surroundings of the microscope are a factor for consideration, these causing losses of spatial definition in the illumination of the sample and/or in the detection of the electrons. The above-described influence of electromagnetic interference fields or air and/or ground vibrations on the imaging quality applies, in principle, to, all imaging and/or raster-mode scanning apparatuses.

One method for eliminating air and/or ground vibrations consists for example in putting the apparatus onto a vibration-damping or vibration-insulating apparatus. However, devices of this type are very expensive. Moreover, these devices offer only limited protection against the above-mentioned ambient influences, above all at very low interference frequencies, as may occur in the event of building vibrations, for example.

In the case of electromagnetic and/or magnetic interference fields, according to the prior art, these fields are detected and compensated for by means of inducing a current flow through a coil outside the apparatus. This method has the disadvantage that although the interference fields are significantly reduced, by means of negative feedback, at the location where the interfering quantity is detected, this is not necessarily the case at the "actual location of occurrence", that is to say along the electron orbits in the case of an electron scanning microscope.

SUMMARY OF THE INVENTION

The object of the invention, therefore, is to provide an apparatus in which ambient influences that may cause imaging degradations or defects are compensated for effectively and without a high financial outlay.

This is achieved in a surprisingly simple manner by means of an apparatus according to the invention and a method for operating an apparatus of this type according to the invention.

Accordingly, a first signal dependent on the ambient influences passes through an adjustable digital electrical filter and drives an actuator and/or a control element which has an effect on the imaging and/or on the image display, in which case, in the calibrated state of the apparatus, which is realized by setting the transfer parameters, that is to say the transfer characteristic of the filter, the image degradation is greatly reduced or essentially compensated for. Setting the filter makes it possible to ensure that the compensation of the ambient influences interfering with the imaging takes place "at the actual location of occurrence", in contrast to apparatuses according to the prior art. The invention can be utilized in a multiplicity of embodiments. In these cases, the outlay can be made dependent on the required degree of compensation of the ambient influences. By way of example, the digital filter, for calibrating the apparatus, may have a calibration input to which a second signal for setting the transfer parameters of the filter is applied, or the filter may have a device for manually setting the transfer parameters. If an output signal of the image processing device is applied to the calibration input of the filter, then, in dependence on the image defects detected, the transfer parameters of the filter can be coordinated in such a way that the interference compensated for is exactly that which affects the imaging, and not the interference at a location in the vicinity of the apparatus.

The first signal which is dependent on the ambient influences and is applied to the signal input of the filter can either be output by a sensor for detecting at least one physical quantity outside the apparatus, or an output of the image processing device is connected to the calibration input of the filter, with the result that the calibration signal depends on an image analysis, for example. If a sensor is used to output the first signal, it is possible to detect electromagnetic and/or magnetic fields, air vibrations and/or body or ground vibrations. In an advantageous manner, an interfering quantity, or alternatively more than one simultaneously, can be picked up and the imaging defects caused by the interfering quantity can be compensated for by the driving of one or more control elements.

The high flexibility of the invention is also demonstrated in the fact that the effect according to the invention on the imaging and/or on the image display can take place in dependence on the interfering quantities in diverse ways. The actuators and control elements used may preferably be internal ones that are present, for example deflection systems or adjustment arrangements of sample stages. In addition to actuators which are assigned to the scanning device, it is possible, furthermore, to use, as further actuators, all systems which, like force actuators or distance drives, are sensitive to vibration, for the purpose of applying the correction signal. Furthermore, it is also possible to realize the compensation of the imaging defects by driving a control element in an image processing device, without influencing the defective imaging itself. In this case, this control element in the image processing direction comprises for example an adjustable parameter for a calculation in the image processing device. The use of multi-axis sensors and control elements advantageously enables the compensation of interference in a number of spatial directions. For this purpose, it is possible, by way of example, to vary the calibration signal at the filter as a function of the scanning location and/or of time.

In an embodiment, the apparatus, for example a microscope, is operated in a calibration mode and subsequently in an image mode, whereby, in the calibration mode, ambient influences that degrade the imaging are detected by the imaging of a predetermined reference object and comparison of the image with the real structure of the reference object, and are greatly reduced or essentially compensated for by calibration, and whereby the imaging defects are compensated for by maintaining the calibration in the imaging mode, even in the event of a change in the ambient influences.

By virtue of the comparison of the image with the real structure of a reference object, the compensation of the interfering ambient influences is carried out on the basis of the imaging defect that is objectively present. As a result, furthermore, in addition to the ambient influences, systematic imaging defects of the apparatus can also be detected and eliminated. While minor fluctuations in the interfering quantity are automatically compensated for, greatly altered ambient conditions, for example caused by the microscope being sited in a new place, can easily be taken into account by means of a calibration cycle in which a new calibration, adapted to the altered conditions, of the apparatus is carried out. The apparatus can be calibrated anew at predetermined time intervals, whereby even changes in the ambient conditions which are not obvious are automatically taken into consideration.

The calibration mode is distinguished by the fact that a correlation is produced between the respective imaging defects that have been detected and the interfering influence detected by a sensor.

Conversely, this means that, from an interfering influence detected by a sensor outside the apparatus, a conclusion can be drawn about the imaging defect caused by this interfering influence and this imaging defect can be compensated for. Moreover, by means of external driving of the scanning device of the apparatus, it is possible to detect a selected section of the reference object, for example along a circle, repeatedly at time intervals. In this way, time-variable imaging defects, for example caused by a building vibration, are also identified. By varying the scanning distance, for example by altering the scanning radius, it is possible, moreover, to detect location-dependent imaging defects, that is to say imaging defects which depend on the scanning location of the exemplary scanning microscope. Consequently, the apparatus according to the invention is set up for the detection and compensation of location- and time-dependent imaging defects.

In the image mode, the actual sample is then detected in its entirety by scanning, the second signal, for setting the transfer characteristic of the filter, advantageously being derived using the data determined during the calibration mode as a basis.

In a further embodiment, the apparatus is set up for automatically calibrating the filter during the image mode. In contrast to the preceding embodiment, the calibration is carried out during the normal image mode. Consequently, by way of example, the customary microscopic sequence is not disrupted since it is not necessary to carry out a changeover between a sample and the reference object. In addition to the advantage of requiring less time, the apparatus responds directly to what may be an unnoticed change in the interfering quantity and is calibrated anew by the transfer characteristic of the filter being set, the signal applied to the calibration input of the filter being derived from an image analysis in the image processing device. By means of a line-by-line image analysis, the displacement of the line centroids of successive image lines within the whole image can be determined, for example recursively, and a second signal can be calculated from this temporal displacement for the purpose of driving the calibration input of the filter. The pixel displacements of the line centroid thus serve as the amplitude of the image interference. The line frequency permits an assignment of time and frequency for a correlation consideration in the case of the active application of a compensation signal dependent on the interfering quantity, that is to say in the case of the driving of an actuator and/or of a control element which have an effect on the imaging and/or the image display. If a sensor arranged outside the apparatus and serving to detect an ambient influence which degrades the imaging is read in in parallel with the interference amplitude determined, at the start of each line, then this enables the simultaneous pick-up of image interference and the external interfering influence causing the latter. This method thus permits a direct calculation of the transfer function of the filter, which is required in order to compensate for the interference. As an alternative, fundamental assumptions may be made, for example with regard to the number of poles and zeros of the transfer functions, and individual parameters, that is to say, for example, the poles and zeros, can be optimized iteratively by means of the image analysis. The line-by-line image analysis permits the filter to be set and thus the ambient influences causing the imaging defects to be compensated for, up to a frequency corresponding to half the detection frequency, in accordance with the Nyquist theorem.

The image analysis may also comprise the recursive determination of the displacement of the image centroid of successive images. This is appropriate for example for transmission electron microscopes or light microscopes, which use a camera system for displaying an object. By determining the displacement of the image centroid in two mutually orthogonal axes, it is thus possible, by means of a corresponding correlation with the interference quantities, to rectify the image defects in two mutually perpendicular directions by the driving of corresponding actuators and/or control elements. The camera systems discussed conventionally operate between 25 and 70 Hz. Although the evaluation and thus also the compensation by the application of compensation quantities even at frequencies which are higher than the image frequency of the camera system used.

In a further advantageous embodiment of the invention, not only the calibration input of the filter is fed by the image processing device, but also the signal input of the filter. Consequently, it is possible for the forward-connected sensor to be dispensed with and only the displacements, obtained from the image analysis, to be fed back into suitable control elements/actuators in two mutually orthogonal directions, in which case the said control elements/actuators, as in all the previous advantageous embodiments, may be assigned to the scanning device and/or to the image processing device or alternatively may be further actuators.

The invention can be used in a multiplicity of imaging and/or raster-mode scanning apparatuses which are suitable for the production or observation and measurement of surfaces, for example scanning electron microscopes, force microscopes, surface roughness measuring instruments, optical scanning microscopes, light microscopes, transmission electron microscopes or lithography installations.

Existing installations can be equipped by simple retrofitting to give apparatuses according to the invention for compensating for ambient influences.

BRIEF DESCRIPTION OF THE DRAWINGS

The invention is described below on the basis of a number of embodiments with reference to the appended drawings, in which:

FIGS. 6a to 6c show the displacement of the image centroid of three successive images.

DETAILED DESCRIPTION OF THE INVENTION

Figure 1:
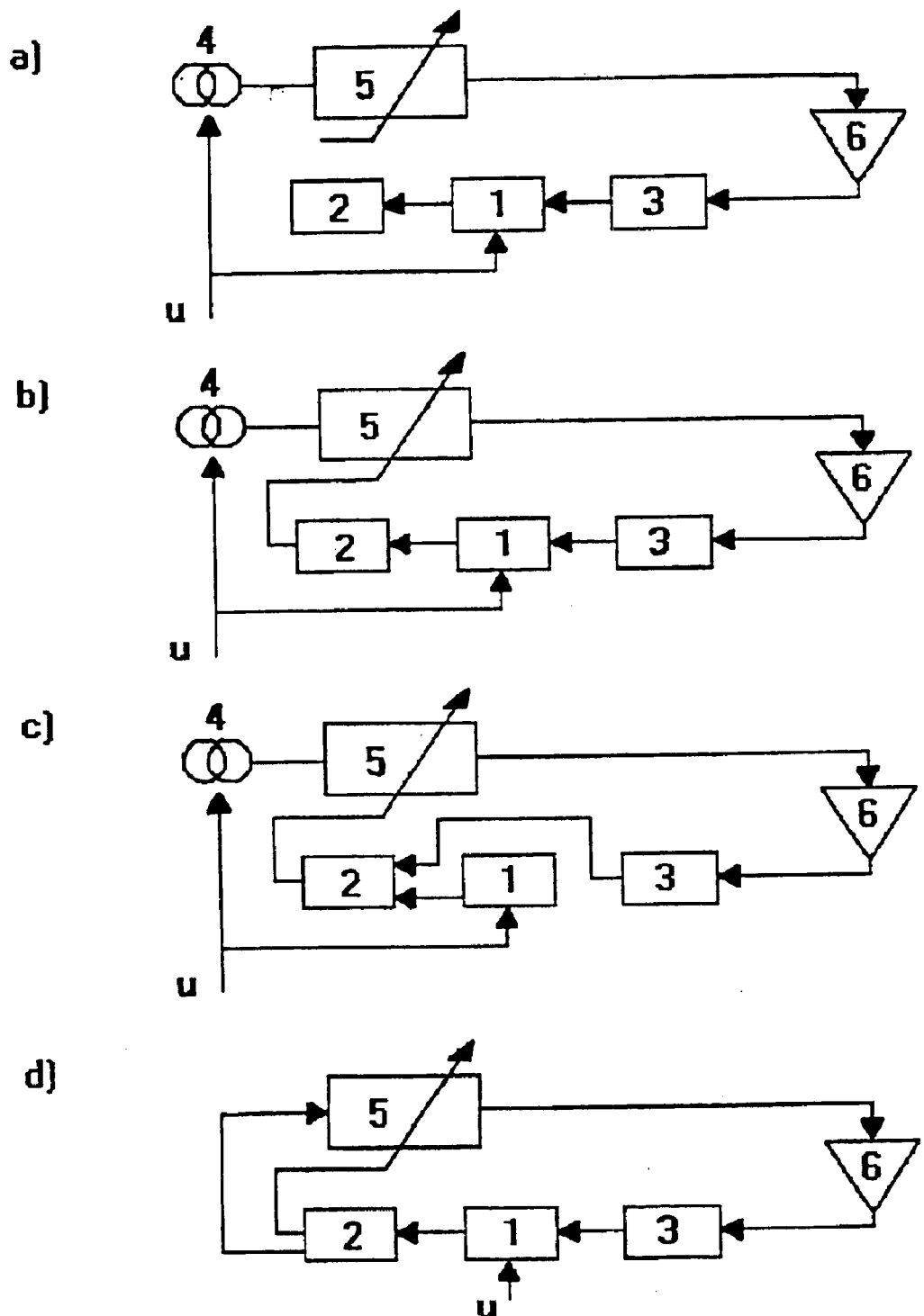
FIGS. 1a to 1d show different embodiments of the invention in the form of block diagrams, FIG. 2 schematically illustrates a scanning microscope according to the invention.

FIG. 1a schematically illustrates an embodiment of the imaging and/or raster-mode scanning apparatus according to the invention in the form of a scanning electron microscope in a block diagram. The numeral 1 designates an-apparatus for scanning sample objects by an electron beam (see also FIG. 2) however not including an internal actuator 3 such as deflection coils 3a, 3b, an image processing device 2 and a compensation device for compensating for ambient influences which may degrade the imaging. The term "scanning electron microscope" also includes device elements such as the image processing device 2, the internal actuator 3, and other elements necessary for operating the microscope. There is a sensor 4 outside the microscope, this sensor 4 outputting a first signal which is dependent on ambient interfering influences U, for example an electromagnetic interference field at the location of the sensor 4. A-digital filter 5 has a transfer characteristic which can be set at a calibration input manually (FIG. 1a) or automatically (FIGS. 1b to 1d). The interfering influence U affects both the sensor 4 and the apparatus 1, this being indicated, in FIGS. 1a to 1d, by the arrows proceeding from U. The first signal is processed in the filter and amplified in a regulating amplifier 6, connected in a loop to the internal actuator 3 such as the electron beam deflection coils 3a, 3b of the scanning electron microscope. The first signal is a compensating signal dependent on the ambient influences and is applied to the signal input of the filter 5. In the embodiments of FIGS. 1a to 1c the sensor 4 is for detecting at least one physical quantity outside the microscope, and in the FIG. 1d embodiment, the image processing device 2 produces the first compensating signal. The regulating amplifier 6 serves for matching the output signal of the filter to the internal actuator 3. Thus, the first compensation signal which is dependent on the interfering quantity, here the electromagnetic interference field, is combined with an actual driving signal of the deflection coils 3a, 3b. It should be understood that the sensor 4 is arranged outside the microscope in such a way that the driving of the actuator 3 does not significantly influence the first signal. The effect achieved by the calibration of the filter 5 is that the applied first compensating signal for the image acquisition corresponds precisely to an opposite effect which is caused by the interfering influence U, here the electromagnetic interference field at the location of the apparatus 1. Consequently, the effect of the first compensating signal and the effect of the interfering electromagnetic field on the imaging essentially cancel each other out. If the scanning electron niicroscpe is moved to a different site, the filter must be calibrated for the purpose of modeling the transfer function.

FIG. 1b shows a block diagram of an arrangement according to the invention, in which the calibration of the filter 5 is carried out automatically by means of a second signal from an image processing device.

Figure 2:
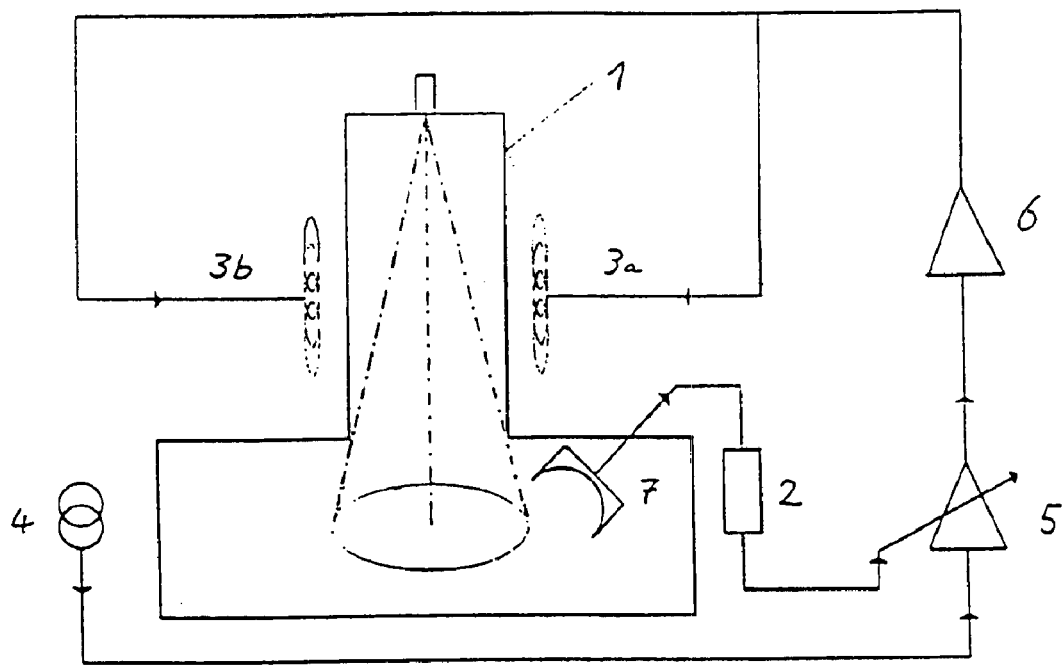

FIG. 2 shows a scanning electron microscope including an image acquisition device which acquires at least one pixel of an object to be scanned and supplies corresponding signals to an image processing device 2. The image processing device 2 also generates calibrating signals and is connected to the calibration input of the filter so as to calibrate same. As in the case of the first embodiment, the first compensating signal of the sensor 4 is fed forwards through the filter 5 and the amplifier 6 to internal actuator implemented by the deflection coils 3a, 3b. The calibration of the filter 5 and thus of the apparatus is described below with reference to two different embodiments.

Figure 3:
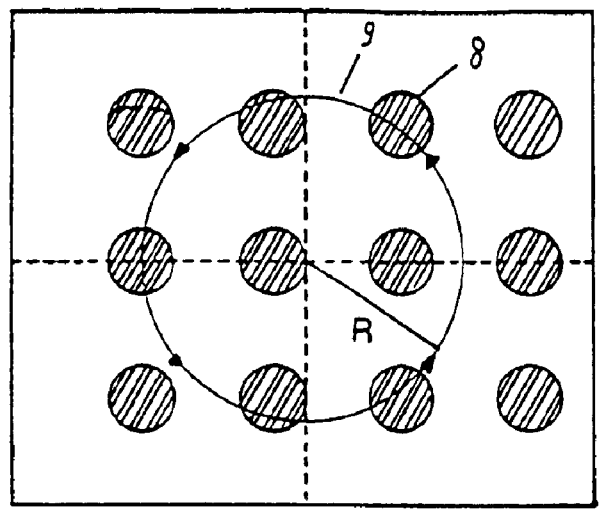
FIG. 3 illustrates an exemplary reference object, of the kind that can be used for the calibration mode of the microscope in FIG. 2.

According to a first embodiment, the microscope is set up for operation in a calibration mode and an image mode, whereby, in the calibration mode, ambient influences that reduce the imaging quality can be detected by the imaging of a predetermined reference object, such as shown at 8 in FIG. 3, and by comparing the image with somewhat corresponding to "the real structure" of the reference object. The ambient influences can essentially eliminated by calibration of the microscope, i.e. the imaging defects are greatly reduced or essentially compensated for, even in the event of a change in the ambient influences, by maintaining the calibration in the image mode. Depending on the operating mode, the input signal of the calibration input of the filter 5 either depends on the respective measured imaging defect (calibration mode) or is obtained by means of the data stored during the calibration mode (image mode). It is possible to switch back and forth between the calibration and image modes.

The calibration mode is utilized in order to detect ambient influences, that is to say in this case the electromagnetic interference field which reduces the imaging quality, by the imaging of a predetermined section of the reference object 8 and comparison of such image with "the real structure" of the reference object, and to calibrate the apparatus by setting the transfer characteristic of the filter in such a way that systematic imaging defects caused by external ambient conditions and/or caused by instrumentation are essentially compensated for.

To this end, an undistorted image of the reference object 8 (FIG. 3) has been stored previously in the image processing device 2.

The scanning microscope acquires an actual image of the reference object 8 by scanning a selected section of the reference object 8, for example along circle 9 as shown. This previously stored image of the reference object 8 is compared with the actual image of the reference object as obtained from the image acquisition device, and a signal assigned to the difference between previous and actual image is formed and is output to the calibration input of the filter.

The calibration method in the calibration mode can be described by the following steps:

determining a first signal, which depends on the electromagnetic interference field at the location of the sensor, by a sensor 4;

applying the first signal to the signal input of the filter 5;

acquiring a selected section of a predetermined reference object by means of an image acquisition device 7 by scanning the reference object;

comparing the acquired image with an undistorted image of the reference object;

determining an error signal assigned to the difference;

applying the second signal, derived from the error signal, to the calibration input of the filter for resetting the transfer characteristic of the filter;

applying the output signal of the filter 5 to the signal input of the regulating amplifier 6;

applying the output signal of the regulating amplifier 6 to the electron beam deflection coils for the purpose of correcting the reduced image quality;

iterative calibration of the characteristic of the filter 5, in such a way that the reduction of the imaging quality is greatly reduced or essentially compensated for, by means of the following steps:

comparing the corrected image with an undistorted image of the reference object;

modifying the transfer characteristic of the filter 5 so as to approximate the corrected image to the undistorted image of the reference object;

storing data for generating the determined transfer function of the filter 5 for the image mode.

In one embodiment, these data for generating the determined transfer function of the filter 5 for the image mode are stored in a memory assigned to the image processing device 2. In a further embodiment, the filter 5 is set up for storing these data. While the imaging defect is being determined, the devices for compensating for the imaging defects are switched off. The microscope according to the invention is then calibrated by the method described above, that is to say the feed forward for the measurement signal of the sensor is set as a measure of the interfering quantity.

The compensation quality is measured by repeated scanning of the reference object and comparison of the image with the real structure of the reference object. By determining the compensation quality in each case and correspondingly changing the transfer function of the filter, the feed forward is iteratively changed in such a way that the imaging defects of the scanning electron microscope are minimized.

The microscope can be calibrated with regard to location- and/or time-variable imaging defects.

Figure 4:
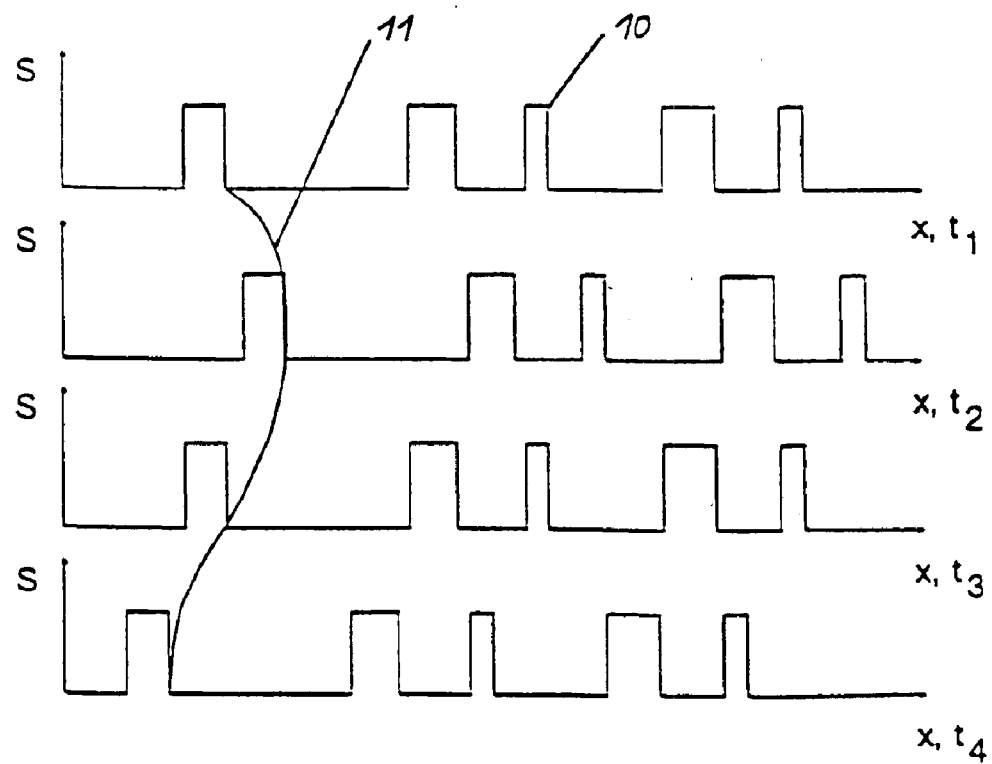
FIG. 4 shows an exemplary signal S of the image acquisition device when the microscope in FIG. 2, in the calibration mode, scans and acquires a reference object on a predetermined path 9 in accordance with the coordinate x at different times.

For this purpose, a reference object as shown in an exemplary fashion in FIG. 3 is scanned on a predetermined path in the calibration mode. The imaged reference object comprises circular gold deposits which have been deposited on a substrate and are arranged in a predetermined manner. The scanning device of the microscope is driven externally, with the result that a selected section of the reference object is acquired. This path may, for example, be closed like that shown by the curve 9. Individual objects 8 are situated on this closed path, to which objects the image acquisition device 2 responds and generates a signal not equal to zero. This is shown schematically and by way of example in FIG. 4, which illustrates the signal profile 10 acquired at a given instant $t_i$ during the traversal of the closed curve 9. Time-dependent interference can cause time-dependent imaging defects. For this reason, in the illustration of FIG. 4, the closed curve has been traversed four times at intervals. The resulting four signal profiles 10 are thus also a measure of the temporal dependence of the interference. Furthermore, the traversed curve is altered by varying the radius R, whereby location-dependent imaging defects can be detected. According to the invention, the time- and/or location-dependent imaging defects are determined by comparison of the image in the image processing device 2 with the predetermined reference object, which is known exactly. In the example represented in FIG. 4, the time-dependent imaging defect is illustrated by the curve 11.

The image mode is the operating mode of the inventive scanning electron microscope in which the actual sample is measured. The filter transfer characteristic determined in the calibration mode is invariant during the subsequent image mode with regard to the characteristic defined in the calibration mode. As explained above, however, it can vary with respect to time and as a function of the scanning location.

Assuming an essentially constant correlation between the electromagnetic interference field and the imaging defect caused by this interfering quantity, the output signal of the filter 5, after passing through the regulating amplifier 6, is applied to the electron beam deflection unit 3, with the result that image defects are essentially compensated for even in the event of a change in the ambient influences, that is to say the strength of the electromagnetic interference field.

In an embodiment developed further, in addition to the electromagnetic interference fields, air vibrations and/or ground vibrations are also detected by corresponding sensors, the signals that are output pass through calibratable filters which are assigned to the respective instances of interference and have adjustable transfer characteristics, and, after additional matching in the regulating amplifier 6, are applied to the deflection unit as a further control signal and/or to other actuators, with the result that the imaging defects caused by air vibrations and/or ground vibrations are also greatly reduced or essentially compensated for.

The necessity of having to switch back and forth between different operating modes of the apparatus is overcome in the embodiment described below by virtue of the fact that the apparatus is set up for automatic calibration of the filter during the image mode. In order to simplify the explanation, this embodiment is again described with regard to a scanning electron microscope, but is not restricted thereto. The apparatus essentially comprises the components of the scanning electron microscope described above, with the exception that in the image processing device the acquired image is analysed and a signal dependent on the analysis is applied as second signal to the calibration input of the filter.

Figure 5:
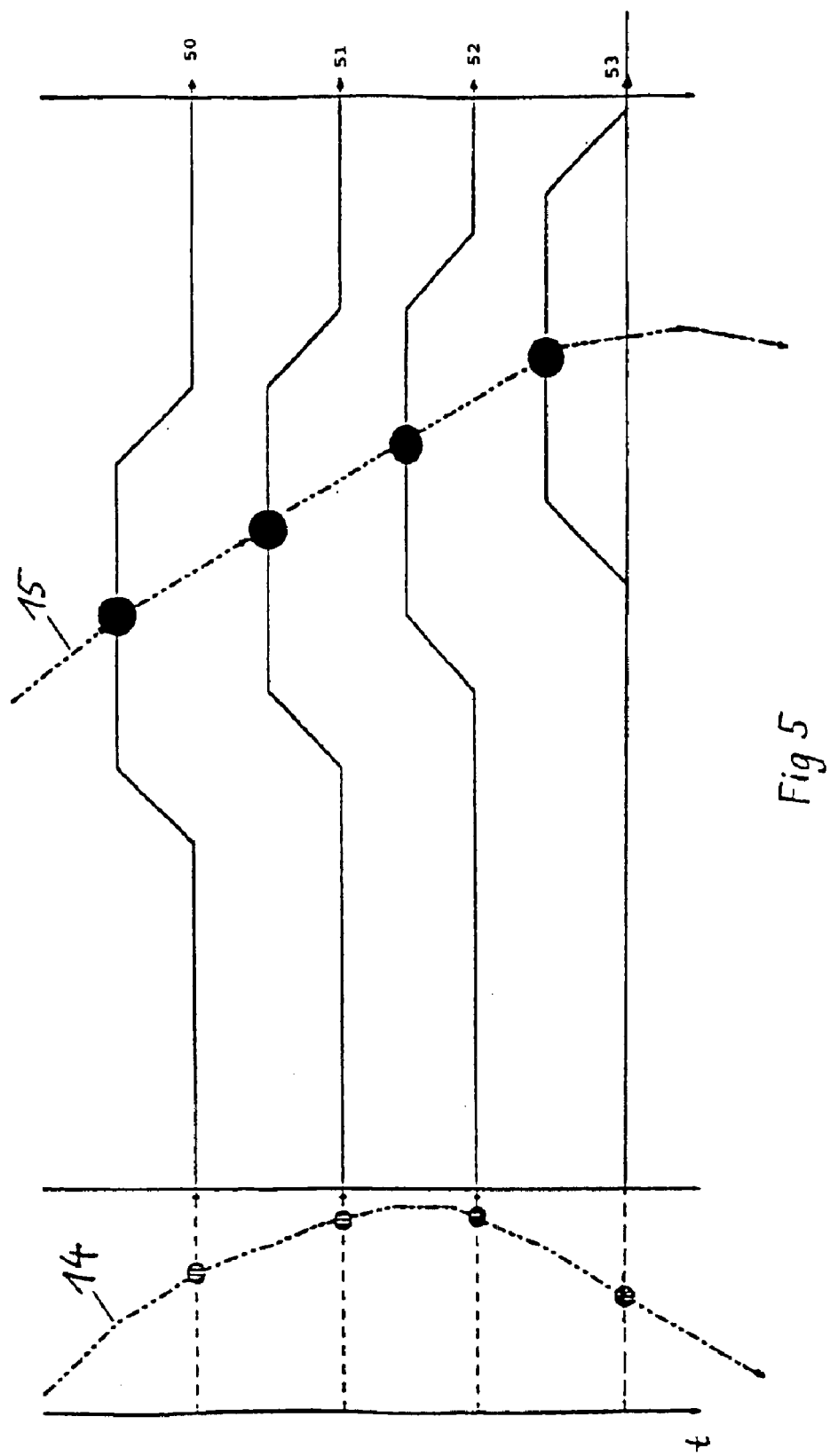
FIG. 5 shows the exemplary correlation between the displacement of the line centroids, which is illustrated by the curve 15, and the temporally corresponding profile 14 of an interfering quantity which is detected outside the apparatus and causes the displacement of the line centroids.

In the exemplary embodiment, this image analysis comprises the recursive determination of the displacement of the line centroids of successive image lines within the whole image. The analysis is based on the insight that images of objects in imaging and/or scanning apparatuses are generally not stable with respect to time on account of the influence of the interfering quantities of the imaging. For elucidation purposes, FIG. 5 illustrates the profile of the brightness within four selected image lines, the centroids of the brightness distribution in each line being identified by a circle and the curve 15 illustrating the displacement of this centroid of the chronologically successively scanned lines. In a manner corresponding to the respective line acquisition instants, the magnitude of an exemplary interfering quantity which causes the corresponding pixel displacement of the centroid within the lines is plotted as curve 14 on the left-hand side. In this way, it is possible to produce a correlation between the interfering quantity and the imaging defect caused by this interfering quantity. The pixel displacement of the line centroid from one image line to the next serves as the amplitude of the image interference. The line frequency permits an assignment of time and frequency for the correlation in the case of the active compensation signal application of the feed forward signal. If the external sensor is read-in parallel with the determination of this pixel displacement at the beginning of each line, a time-parallel or simultaneous detection of the image interference and of the interfering influence that causes this interference can be performed. In principle, assuming sufficient coherence, it is thus possible to directly calculate the transfer function to be set at the filter 5 in order to essentially compensate for the image interference. In an alternative embodiment, fundamental assumptions are made concerning the poles and zeros of the transfer function of the filter, and the individual parameters of the variably configured functions are optimized iteratively.

An method for determining the centroid displacement of successive lines is briefly outlined below. On the basis of the sampling theorem, it is possible to compensate for interference frequencies, which are less than half the sampling frequency. Furthermore, the method presupposes that individual objects within the image are very much larger than the line spacing and that centroid displacements perpendicular to the scanning direction in the image are small in comparison with centroid displacements parallel to the line direction. Moreover, it is assumed that the difference in the intensity $å_n$ (t) of neighbouring lines is small, and the intensity $f_{n+1}$ of the line n+1 can be written as follows:

i. $f_{n+1}(t) = f_n(t) + å_n(t)$.

If this system is then interfered with, assuming that the interference causes a temporal displacement $\ddot{A}_n$ of the pixels within the line, the disturbed intensity $d_n$, (t) is given by:

$d_{n+1}(t) = t_{n+1}(t + \ddot{A}_{n+1}) = f_n(t = \ddot{A}_{n+1}) + å_n(t + \ddot{A}_{n+1})$ and $d_{n+1}(t) = d_n(t + \ddot{A}_{n+1} - \ddot{A}_n) + å_n(t + \ddot{A}_{n+})$.

Using a non-causal Wiener filter, it is possible to calculate a a pulse as a function of the line displacements $\ddot{A}_{n+1}$ and $\ddot{A}_n$:

$å(t + \ddot{A}_{n+1}) \approx FFT^{-1}\{D^*_{n+1}\grave{u})/|D_n(\grave{u})|^2 + \ddot{a}^2 å\}$, where $D_n$, ($\grave{u}$) is the Fourier transform of the disturbed intensity $d_n(t)$. This a function depends on the difference between the centroid displacement of neighbouring lines. Consequently, the centroid displacement within the lines of an image can be calculated recursively, since, as explained above ($\ddot{A}_{n+1} - \ddot{A}_n$) is known as a result of the image analysis.

For the driving of the deflection unit of the microscope, a signal which is proportional to the correlation function of the measured interfering quantity and the calculated centroid displacements in the individual lines is generated using a vector correlation. This correlation is carried out in the digital filter, a second signal, which is dependent on the temporal displacement calculated, being applied to the calibration input of the filter.

Figure 7:
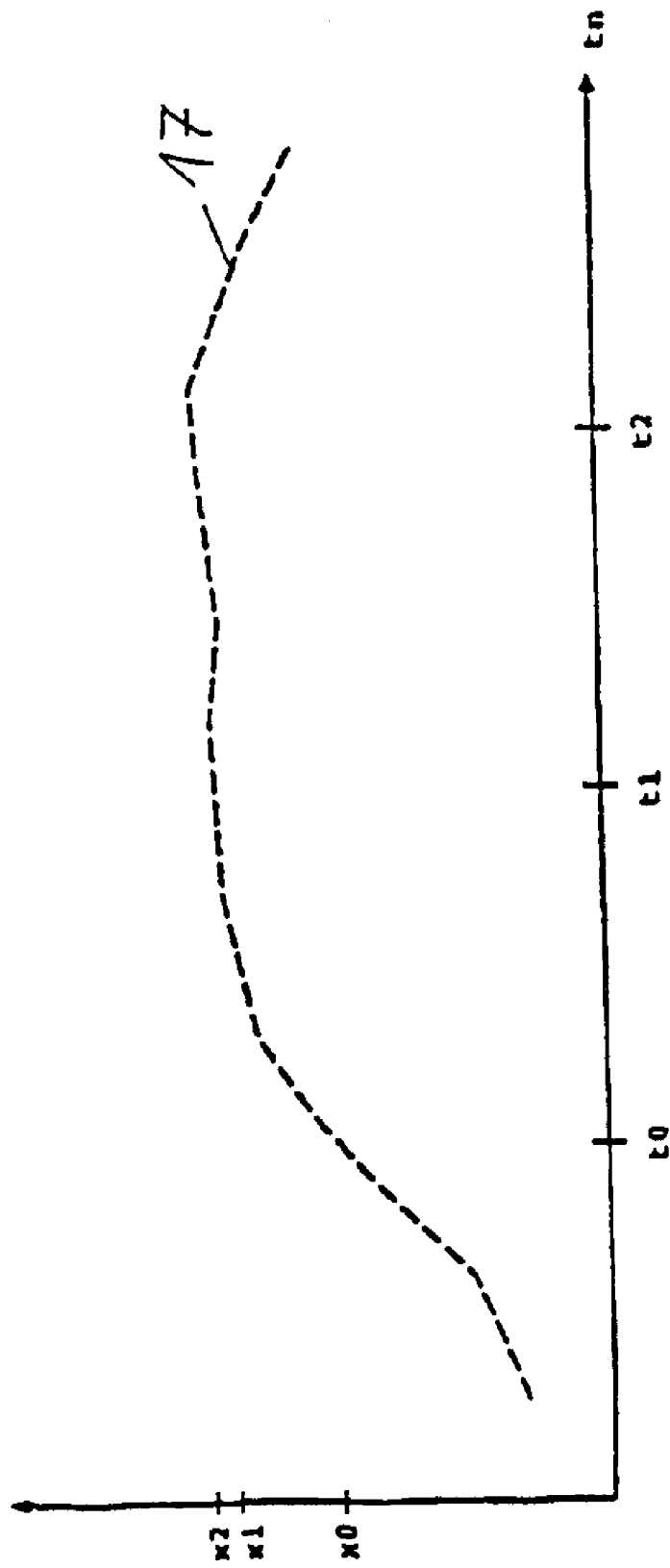
FIG. 7 shows the temporal profile 17 of the displacement of the centroid from FIG. 6 for the x-direction.
Figure 8:
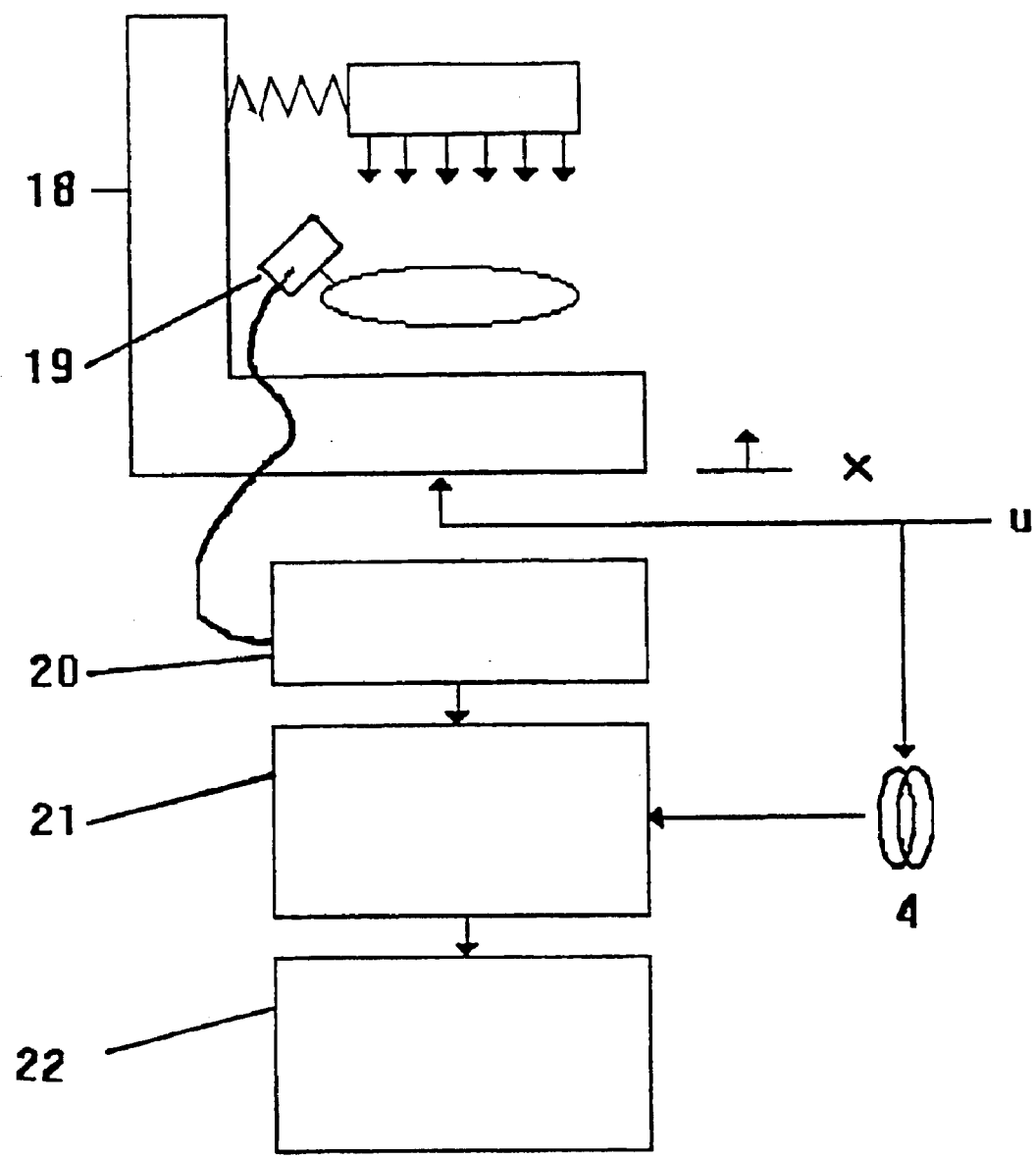
FIG. 8 shows an embodiment of an optical microscope corresponding to the block diagram of FIG. 1c.

A further embodiment of the invention (FIG. 8) is suitable for example for transmission electron microscopes (TEM) or light microscopes or related types of apparatuses which use a camera system 20 to display the object. In the embodiment described below, the apparatus illustrated in the block diagram in FIG. 1c corresponds to the optical microscope 18 illustrated in FIG. 8. The external sensor 4 is designed as a multi-axis vibration sensor whose signal is passed via an adjustable filter 5 and an amplifier 6 to a control element, which, in the present embodiment, is assigned directly to the imaging processing device 21 and has an effect on the image in the latter. In FIG. 8, the filter, the amplifier and the control element are not explicitly shown but rather are contained integrally in the image processing device 21. According to the invention, then, in this apparatus a compensation signal is not applied to an actuator which influences the imaging, rather, instead of this, the image display is influenced directly. The camera system comprises a CCD camera 19 with a monitor, an image frequency of 25 Hz being worked with. The image processing device 21 is set up for storing successive images. By means of image analysis, the displacement of the image centroid of successive images in two mutually orthogonal directions is calculated and used to set the transfer function of the digital filter 5 in a similar manner to that in the embodiment described above. An illustrative representation of this displacement of the centroid of successive images is shown in FIGS. 6 and 7. The curve 17 in FIG. 7 shows the profile of the coordinate x of the centroid with time. The differences between two scanning points, for example $t_0$ and $t_1$, thus correspond to the image refresh frequency. A further embodiment, in comparison with the embodiment described above, enables instances of interference to be corrected by the compensation signal application even at frequencies which are greater than the image refresh frequency of 25 Hz. For this purpose, the transfer function, which is defined by the points of resonance in the mechanical construction of the microscope, is implemented as the filter 5. In this way, a base vibration X generates a relative movement $\ddot{A}x$ at the microscope. The general transfer function is thus completely determined by the actual sensitivity $\ddot{A}x/X$, the resonant frequency $f_R$ and by the parameter Q, which defines the asymptotic decline of $\ddot{A}x/X$ at high frequencies. By determining three points on the curve below the resonant frequency $f_R$ as well, it is thus possible to infer the entire function and use it in the feed forward control by application of a compensation signal also for interference frequencies which are greater than the image refresh frequency.

In contrast to the embodiments described heretofore, according to the invention it is possible, moreover, to use the image information not in a feed forward arrangement but in a traditional feedback arrangement for the compensation of image interference. This is illustrated schematically in the block diagram 1d. The sensor whose signal is fed forwards is omitted, and instead of this the centroid displacements determined in the x- and/or y-axis from the image analysis are fed back into a suitable control element, in this case a device for displacing the sample, after passing through an adjustable transfer function.

In further embodiments (not illustrated in any detail here) of the invention, the apparatus may be a force microscope, a surface roughness measuring instrument, an optical scanning microscope or a lithography installation.

Depending on the embodiment, in the case of electron microscopes, the driven actuators and control elements comprise the already described electron beam deflection devices and/or control elements in the image processing device, and in the case of optically operating apparatuses, the actuators comprise, depending on the embodiment, devices for deflecting the light and/or devices for deflecting the sample and/or control elements in the image processing device. A control element in the image processing device in this case designates, by way of example, the influence on a parameter which has effects on the calculation of the image. Moreover, use is made of further actuators which are sensitive to vibrations, and also force actuators electrodynamic linear drives) and distance drives (piezotranslators).

What is claimed is:

1. At least one of an imaging and raster-mode scanning apparatus comprising
a sample holder for holding a sample object,
one means selected from the group comprising
means for generating an electron beam,
means for generating a light beam, and
means for determining a force onto said sample object
actuator means for moving one of said electron beam, light beam or force determining means relative to a said sample object so as to form a scanner,
means for forming an image when the position of one of said electron beam, light beam or force determining means is moved relatively to said sample object and optionally to a predetermined reference object so as to produce image signals,
an image processor for processing said image signals,
an image display device,
an electrical filter having a signal input and a calibration input,
at least one sensor that provides a first signal dependent on ambient influence that might interfere with proper imaging and lead to image degradation,
said electrical filter having a settable transfer characteristic that can be set by applying a second signal to said calibration input of said electrical filter so as to calibrate said apparatus, wherein said ambient influences detected by said sensor are compensated to a certain extent, and
wherein said first signal dependent on the ambient influences passes through said electrical filter and is combined with driving signals for said actuator means of the apparatus to compensate said ambient influences that might interfere with proper imaging.

2. The apparatus according to claim 1, wherein the at least one sensor is adapted to detect at least one physical quantity outside the apparatus, and to output the first signal that depends on the ambient influences at the location of the at least one sensor.

3. The apparatus according to claim 2, wherein the at least one sensor comprises at least one pick-up for electromagnetic fields, air vibrations and ground vibrations.

4. The apparatus according to claim 1, wherein said signal input of the electrical filter is connected to an output of said image processor.

5. The apparatus according to claim 1, further comprising a calibrator that mutually calibrates the filter.

6. The apparatus according to claim 1, said electrical filter is a digital filter.

7. The apparatus according to claim 1, wherein an output of the image processor is connected to said calibration input of the electrical filter.

8. The apparatus according to claim 1, wherein the second signal varies as a function of said relative position of said electron or light beam to said object.

9. The apparatus according to claim 1, wherein the apparatus operates in a calibration mode and subsequently operates in an image mode, whereby, in the calibration mode,
a first image signal of said reference object is provided in said image processor,
a second image signal of said reference object is provided under ambient influences,
then the first image signal and the second image signal are compared in the image processor resulting in an error signal which is said second signal for calibrating said electrical filter by setting said transfer characteristic thereof, and
wherein by calibration of the electrical filter, ambient influences that degrade the image signals are compensated to a certain extent.

10. The apparatus according to claim 9, wherein in the calibration mode:
said first image signal of the reference object being present in said image processors, the apparatus scans, under ambient influences, a selected section of the reference object so as to obtain said second reference image signal,
the image processor compares said first reference image signal with said second reference image signal, so as to form said error signal from any difference resulting from said comparison, and
wherein the apparatus stores, in a memory, data for generating the second signal for setting the transfer characteristics of the electrical filter for the image mode.

11. The apparatus according to claim 10, wherein in the image mode:
the apparatus scans the sample object to be imaged, and
taking said data stored during the calibration mode as a basis, generates the second signal for defining the transfer characteristics of the electrical filter.

12. The apparatus according to claim 2, wherein the apparatus is set up for automatically calibrating the electrical filter during an image mode.

13. The apparatus according to claim 12, wherein said image forming means is adapted to scan said sample object to form successive image lines which define line centroids, or image centroids, and said image processor is set up for determining a temporal displacement of said line centroids of successive image lines across the image and outputs to the electrical filter, the second signal as a function of this temporal displacement.

14. The apparatus according to claim 13, wherein the image processor is set up for determining a temporal displacement of said image centroids of successive images scanned by the image forming means and outputs the second signal as a function of this temporal displacement, as determined, to the electrical filter.

15. The apparatus according to claim 12, wherein the electrical filter is set up for carrying out a cross-correlation of the first signal and of the second signal.

16. The apparatus according to claim 14, in the form of a light microscope or a transmission electron microscope also comprising means for analyzing temporal displacement in said image signals, the first signal also being determined from the temporal displacement that is determined in said image signals.

17. The apparatus according to claim 1, wherein the apparatus is set up for reducing or compensating for the image degradation in two mutually orthogonal directions.

18. The apparatus according to claim 1, wherein the apparatus comprises one of a scanning electron microscope, a force microscope, a surface roughness measuring instrument, an optical scanning microscope, a light microscope, a transmission electron microscope or a lithography installation.

19. The apparatus according to claim 18, wherein in the case of the electron microscope, said actuator means comprises at least one of a deflector for deflecting electron beam and a displacer that displaces said sample object.

20. The apparatus according to claim 18, wherein in the case of the optical scanning microscope, said actuator means comprises a deflector device for deflecting said light beam or a displacer that displaces said sample object.

21. The apparatus according to claim 7, wherein the apparatus is designed for operation in a calibration mode and for subsequent operation in an image mode, whereby, in the calibration mode
a first image signal of said reference object is provided, and under ambient influences, a second image signal of said reference object is provided, then the first image signal and the second image signal are compared in the image processor,
wherein the comparison results in a difference representing an error signal being assigned to the second signal for setting the transfer characteristic of said electrical filter, whereby by calibration of the electrical filter ambient influences which degrade the image signals are compensated to a certain extent.

22. The apparatus according to claim 7, wherein the apparatus is set up for automatically calibrating the electrical filter.

23. The apparatus according to claim 7, in the form of a light microscope or a transmission electron microscope also comprising means for analyzing temporal displacement in said image signals, the first signal also being determined from said temporal displacement in said image signals.

24. The apparatus according to claim 4, for operation in a calibration mode and subsequently operable in an image mode, whereby, in the calibration mode, a first image signal of said reference object is provided, and under ambient influences, a second image signal of said reference object is provided, then the first image signal and the second image signal are compared in the image processor,
wherein the comparison results in a difference representing an error signal being assigned to the second signal for setting the transfer characteristic of said electrical filter as to reduce ambient influences which might degrade imaging.

25. A light microscope comprising
a sample holder for holding a sample object,
a camera system for forming an image of said sample object,
actuator means for moving said camera system relative to said sample object,
means for converting said image of said sample object and optionally of a predetermined reference object into image signals,
an image processor for processing said image signals,
an image display device,
a digital electrical filter having a signal input and a calibration input,
wherein said image processor, based on analysis of successive image signals, provides a first signal, to be supplied to said signal input of said digital electrical filter,
wherein said image converting means and said image processor cooperate to provide a second signal to be supplied to said calibration input of said digital electrical filter,
said electrical filter having a settable transfer characteristic that can be set by applying said second signal to said calibration input of the electrical filter to effect the apparatus into a calibrated state,
wherein said ambient influences are compensated to a certain extent, and
wherein said first signal passes through said electrical filter and is combined with driving signals for said actuator means of the apparatus to compensate said ambient influences.

26. A method for operating an imaging or raster-mode scanning apparatus for compensating ambient influences that may degrade the imaging of a sample object, the apparatus including an internal actuator or internal control element and an image processor, comprising the steps of:
providing a driving signal and driving said actuator or control element to produce an image of the sample object,
providing a first signal dependent on the ambient influences,
supplying said first signal to a signal input of an electrical filter having a settable transfer characteristic which can be set by applying a second signal to a calibration input of the electrical filter, and
passing the first signal directly through said electrical filter,
providing an output signal of the electrical filter,
combining said driving signal for said internal control element of the apparatus with said output signal of said electrical filter, which has an effect on the imaging of said image processor, effecting the apparatus into a calibrated state, by applying said second signal to the calibration input of the electrical filter for setting the transfer characteristic, such that any image degradation from ambient influences is compensated to a certain extent.

27. The method according to claim 26, wherein the calibration of the apparatus is carried out by manual setting of the electrical filter.

28. The method according to claim 26, wherein said internal control element is a member of said image processor for effecting the compensation of the image degradation.

29. The method according to claim 26, wherein said internal actuator is a means for moving an electron beam relatively to a sample object so as to form a scanner and the compensation of the image degradation is carried out at least partially by driving said internal actuator.

30. The method according to claim 26, also including:
providing a sensor which is arranged outside said imaging or raster-mode scanning apparatus and is for detecting ambient influences that degrade the imaging, and drives said first signal input of said electrical filter,
providing a predetermined reference object and a first image signal of said reference object,
wherein the apparatus is operated in a calibration mode by applying said second signal to said calibration input of said electrical filter which is produced by imaging of said reference object under ambient influences to obtain a second image signal and comparing the second image signal of the reference object with said first image of the reference object, and
wherein the apparatus is subsequently operated in the image mode.

31. The method according to claim 30, wherein the calibration mode comprises at least the following steps:
acquiring an image of a selected section of the predetermined reference object by scanning the reference object avoiding degradations so as to produce said first image signal of the selected section;
determining the first signal which depends on any ambient influence at the location of the sensor, which is arranged outside said imaging or raster-mode scanning apparatus;

applying the first signal to the signal input of said electrical filter;

acquiring an image of said selected section of the predetermined reference object by scanning of the reference object under ambient influence so as to produce said second image signal of the selected section;

comparing said second image signal of the selected section of the reference object under ambient influences with said first image signal of the reference object so as to form an error signal which is a difference between said first image signal and said second image signal;

applying said second signal, derived from said error signal, to the calibration input of said electrical filter for setting the transfer characteristic of the electrical filter;

applying the signal of the electrical filter to the signal input of a regulating amplifier;

applying the output signal of said regulating amplifier to said internal actuator which is for scanning said reference object by deflecting an electron or light beam by moving a holder for said reference object relative to said beam, said deflecting of said beam or said moving of said holder being influenced so as to correct imaging;

repeating the iterations of the steps of comparing said second image signal and said first image signal so as to modify said characteristic of said electrical filter for minimizing said error signal and storing data determined by iterative calibration for providing the transfer characteristic of the electrical filter for said image mode.

32. The method according to claim 30, wherein the image mode comprises the following steps:

acquiring an image signal of said sample object by scanning, with said settable transfer characteristic of said electrical filter being fixed in said calibration mode, passing said output signal of said electrical filter through a regulating amplifier, and supplying said amplifier output signal to said internal actuator to control element.

33. The method according to claim 26, wherein said image processor makes an image analysis of an image of a sample object or a reference object acquired by said imaging or raster-mode scanning apparatus and produces a setting signal dependent on such image analysis which is applied as said second signal to said calibration input of said electrical filter.

34. The method according to claim 33, wherein the image analysis comprises a recursive determination of a temporal displacement of line centroids of successive image lines within the image of said reference object, and whereby said second signal is calculated from said temporal displacement.

35. The method according to claim 33, wherein successively images of said reference object are taken, wherein the image analysis comprises a recursive determination of a temporal displacement of image centroids of said successive image, and wherein said second signal is calculated from said temporal displacement.

36. The method according to claim 34, wherein essentially a cross-correlation of the first signal with the second signal is carried out and an output signal of the electrical filter which is dependent on the cross-correlation between the first signal and the second signal is supplied to said actuator or control element.

37. The method according to claim 26, comprising the steps of feeding said image processor with an image signal from an image acquirer;

applying a signal dependent on the result of said analyzing step as said first signal to said signal input of the electrical filter;

applying a signal dependent on the result of the analyzing step as the second signal to said calibration input of the electrical filter; and applying the output of the electrical filter via a regulating amplifier to said internal actuator or said internal control element so as to reduce imaging degradation.

38. The method according to claim 37, wherein, in successive time periods, successive images of said sample object or of a reference object are produced, successive image lines within any successive image and the centroids thereof or image centroids of successive images are determined, and wherein said analyzing step comprises a recursive determination of any displacement of said line centroids of said successive image lines within the image or a recursive determination of any displacement of said image centroids of successive images.

39. The method according to claim 26, wherein control elements acting in two mutually orthogonal directions are provided for compensating any image degradation.

40. An apparatus for compensating for ambient influences in imaging or raster-mode scanning apparatuses the may degrade the imaging with an image acquisition and an image processing device producing an image of a sample object or a reference object, comprising a calibratable digital electrical filter with a signal input and a calibration input;

a regulating amplifier which is electrically connected downstream of the electrical filer, an internal control element controlled by the regulating amplifier;

wherein a second signal is applied to the calibration input of the electrical filter to calibrate the electrical filter; and wherein the internal control element has an effect on said image produced by said image acquisition and image processing device, whereby in the calibrated state of the electrical filter, the image degradation is compensated to a certain extent.

41. The apparatus according to claim 40, further comprising at least one sensor for detecting at least one physical quantity outside the imaging or raster-mode scanning apparatus, this sensor outputting the first signal which is dependent on the ambient influences at the location of the sensor.

* * * * *